United States Patent [19]
Wang

[11] Patent Number: 5,191,232
[45] Date of Patent: Mar. 2, 1993

[54] HIGH FREQUENCY VOLTAGE MULTIPLIER FOR AN ELECTRICALLY ERASABLE AND PROGRAMMABLE MEMORY DEVICE

[75] Inventor: Ping Wang, Saratoga, Calif.

[73] Assignee: Silicon Storage Technology, Inc., Sunnyvale, Calif.

[21] Appl. No.: 852,529

[22] Filed: Mar. 17, 1992

[51] Int. Cl.$^5$ ............... H03L 5/00; H03K 17/687
[52] U.S. Cl. .................. 307/264; 307/296.2; 307/578; 307/482
[58] Field of Search ............ 307/296.2, 264, 578, 307/482, 529

[56] References Cited

U.S. PATENT DOCUMENTS

| | | | |
|---|---|---|---|
| 4,656,369 | 4/1987 | Lou | 307/296.2 |
| 4,935,644 | 6/1990 | Tsujimoto | 307/296.2 |
| 4,970,409 | 11/1990 | Wada et al. | 307/264 |
| 5,029,282 | 7/1991 | Ito | 307/296.2 |

FOREIGN PATENT DOCUMENTS

0089031  5/1984  Japan ...................... 307/296.2

Primary Examiner—William L. Sikes
Assistant Examiner—Toan Tran
Attorney, Agent, or Firm—Limbach & Limbach

[57] ABSTRACT

A charge pump has a chain of diode connected MOS transistors to generate a high voltage output. Each of the serially connected MOS transistors has a capacitor with one end connected to the input of one of the transistors. A ring oscillating circuit receives an enable signal and generates a plurality of oscillating signals. Each oscillating signal has the same frequency and is supplied to the second end of a capacitor. Between each capacitor the ring oscillating circuit has an inverter which inverts the supplied oscillating signal. Thus, immediately adjacent capacitors are provided with an inverse oscillating signal. In this manner, the charge pump can be operated at a high frequency, drawing smoother current from the power supply, with greater capacitive loading distributed unto each stage of the oscillator. Finally, breakdown prevention needs only applied to the anode of the last diode.

5 Claims, 2 Drawing Sheets

HIGH FREQUENCY VOLTAGE MULTIPLIER FOR AN ELECTRICALLY ERASABLE AND PROGRAMMABLE MEMORY DEVICE

TECHNICAL FIELD

The present invention relates to a voltage multiplier for use with an electrically erasable and programmable memory device, commonly known as a charge pump. More particularly, the charge pump of the present invention can be operated at a very high frequency to increase the output current and decrease the size of the capacitors.

BACKGROUND OF THE INVENTION

In the prior art, a voltage multiplier using two out-of-phase clock signals to drive a series of capacitors to pump charges through a chain of serially connected MOS transistors acting as a series of diodes to generate a high voltage output is well known. However, because there is a large capacitive loading on the clock signals, it is difficult to drive such a charge pump at a very high frequency clock signals. The typical clock frequency is around 10 MHz. However, the output current of a charge pump or a voltage multiplier is proportional to the operating frequency of the clock signal applied thereto. Thus, the output current I is determined in accordance with $I = FC(V_{pp} - V_t - V_{out}/n)$, where F is the frequency of the clock signal, C is the capacitance, $V_{pp}$ is the peak-to-peak voltage of clock signals, $V_t$ is the threshold of the MOS transistors, $V_{out}$ is the output voltage, and n is the number of pumping stages. Since there is a limitation in the frequency of the clock signals to drive the voltage multiplier, the current is limited by the capacitance. Capacitance in a semiconductor circuit, however, takes up a large amount of area and thus it is desirable to reduce the capacitance while at the same time maintaining high current output.

SUMMARY OF THE INVENTION

Accordingly, in the present invention a charge pump for use with an electrically erasable and programmable memory device is disclosed. The device receives an enable signal, a first voltage and generates a second voltage which is higher than the first voltage in response thereto. The pump comprises a plurality of diode means connected in series forming a chain of diode means. The chain of diode means has a first diode means and a last diode means with each diode means having an anode and a cathode with the anode connected to the cathode of an immediately adjacent diode means. The cathode of the last diode means supplies the second voltage. A first voltage is supplied to the anode of the first diode means. A plurality of capacitor means is also provided. Each of the capacitor means has two ends: a first end is connected to an anode of each of the diode means. A ring oscillating means receives the enable signal and generates a plurality of oscillating signals with each oscillating signal having the same frequency. One oscillating signal is supplied to the second end of each of the capacitor means with the oscillating signals supplied to the second end of each capacitor means being the inverse of the oscillating signal supplied to an immediately adjacent capacitor means.

DETAILED DESCRIPTION OF THE DRAWINGS

Figure 1:
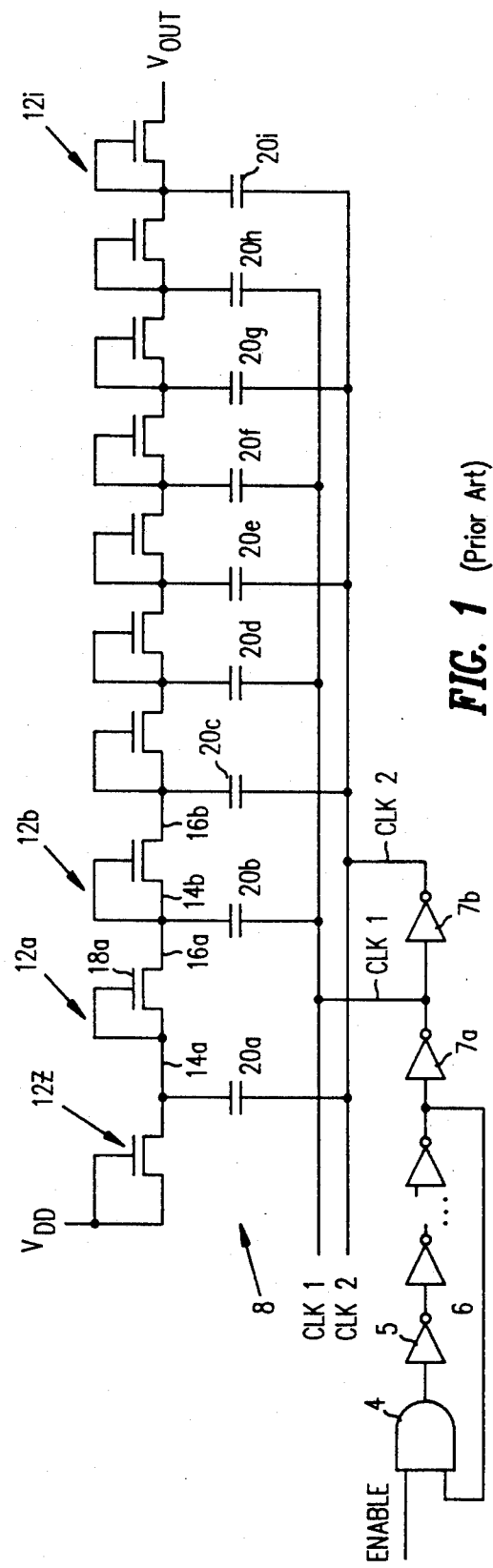
FIG. 1 is a circuit diagram of the voltage multiplier or charge pump of the prior art.

Referring to FIG. 1 there is shown a circuit diagram of a voltage multiplier 8 of the prior art. The voltage multiplier 8 of the prior art comprises a plurality of MOS transistors $12(a \ldots i)$ which are connected in series to form a chain of diode connected MOS transistors. Each of the MOS transistors 12 has an input 14, an output 16, and a gate 18. The gate 18 of the MOS transistor 12 is connected to the input 14. Each of the input 14 is connected to the output of an adjacent MOS transistor 12. Although nine MOS transistors $12(a \ldots i)$ are shown, it can be appreciated that the number of MOS transistors 12 can be any design choice. The output of the last MOS transistor 12i provides the high voltage output of the voltage multiplier 8. A first MOS transistor 12z supplies a first voltage, typically $V_{dd}$ or +5 volts to the input 14a of the MOS transistor 12a. The first MOS transistor 12z has its gate 18z connected to its input 14z which is connected to the source of first voltage $V_{dd}$. The output 16z of the first MOS transistor 12z is connected to the input 14a of the MOS transistor 12a.

A plurality of capacitors $20(a \ldots i)$ are also provided. Each capacitor 20 has two ends, a first end is connected to the input 14 of each of the MOS transistors 12.

Two out-of-phase clock signals (CLK1 and CLK2) are provided to drive the voltage multiplier 8. The first clock signal CLK1 is supplied to the second end of the capacitors 20b, 20d, 20f, and 20h. The second out-of-phase clock signal CLK2 is connected to the second end of the capacitors 20a, 20c, 20e, 20g, and 20i. The clook signals CLK1 and CLK2 are typically 180° out-of-phase and thus are inverse of one another.

The clock signals (CLK1 and CLK2) are generated by a ring oscillator 6. The ring oscillator 6 comprises a chain of inverters 5, connected in series, with a NAND gate 4, to which is supplied an enable signal. The output signal of the ring oscillator 6 is used to drive a first driver 7a and a second driver 7b. The output of the first and second drivers 7a and 7b are the clock signals CLK1 and CLK2.

There are at least two problems with the voltage multiplier 8 of the prior art. First, because the clock signals CLK1 and CLK2 must drive a plurality or a large number of capacitors 20, each of the drivers 7a and 7b for the clock signals CLK1 and CLK2 must be large. Secondly, using large drivers 7a and 7b to drive large capacitive loads causes large power supply current spikes at transition edges of the clock signals. Further, large current spikes may present noises to other circuits on the same chip. As a result, as previously discussed, because of the equation which governs the current output of the voltage multiplier 8 is dependent in part upon the frequency of the clock signals, the capacitors 20 must be made relatively large in order to assure that the current of the voltage output is sufficient for use with an electrically erasable and programmable memory device. Further, as the number of electrically erasable and programmable memory cells in a single integrated circuit increases, the amount current used to program and to erase the memory device also increases.

Figure 2:
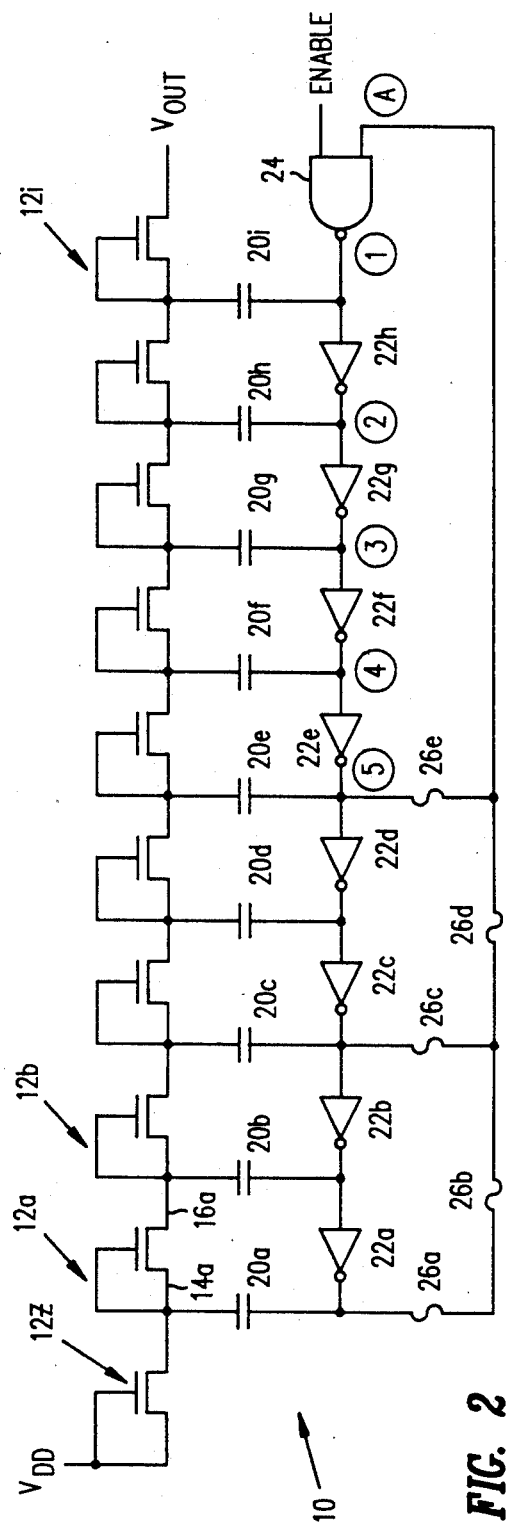
FIG. 2 is a circuit diagram of the voltage multiplier or charge pump of the present invention.

Referring to FIG. 2 there is shown a circuit of the voltage multiplier 10 of the present invention. Similar to the voltage multiplier 8 of the prior art, the voltage multiplier 10 of the present invention comprises a plurality of MOS transistors 12($a \ldots i$), each of which is connected in a series. Each of the MOS transistors 12 has an input 14 and an output 16 with the input 14 connected to the output 16 of an immediately adjacent MOS transistor 12. Each of the MOS transistors 12 further has a gate 18 which is connected to the input 14. The chain of MOS transistors 12 form a chain of diode-connected MOS transistors 12. The output 14$i$ of the last of the chain of MOS transistors 12$i$ supplies the high voltage output. Similar to the voltage multiplier 8 of the prior art, a first MOS transistor 12$z$ supplies the first voltage, $V_{dd}$, to the input 14$a$ of the MOS transistor 12$a$. The first MOS transistor 12$z$ has its input 14$z$ connected to the gate 18$z$ which is connected to a source of relatively low potential such as $V_{dd}$. The output 16$z$ is connected to the input 14$a$.

Also similar to the voltage multiplier 8 of the prior art, the voltage multiplier 10 of the present invention comprise a plurality of capacitor means 20($a \ldots i$). Each of the capacitors has two ends. One end of each of the capacitors 20 is connected to the input 14 of each of the MOS transistors 12.

A ring oscillator generates a plurality of oscillating signals. Each oscillating signals has the same frequency and is supplied to the second end oscillator comprises a plurality of inverter means 22($a \ldots h$). Each of the inverter means 22 is an inverter and has an input and generates an output which is the inverse of the input supplied thereto. The plurality of inverters 22($a \ldots h$) form a chain output of the immediately adjacent inverter means 22. Thus, the inverter 22$h$ generates an oscillating signal which is supplied to the capacitor 20$h$ and to the input of the inverter 22$g$. The inverter 22$g$ generates an oscillating signal, in response to the input supplied thereto, and which is supplied to the input of the inverter 22$f$ as well as to the capacitor 20$f$. Finally, a two input NAND gate 24 generates a first oscillating signal which is supplied to the capacitor 20$i$ and to the input of the inverter 22$h$, which is the first of the chain of inverters.

The NAND gate 24 receives as one of its input an enable signal. If it is desired to generate the oscillating signals which are supplied to each of the capacitors 20, the enable signal goes high. Otherwise, it is low. The second input to the NAND gate 24 is supplied from one of the outputs of the inverters 22. A plurality of fusible links or alternatively, metal mask option, 26($a \ldots e$) are provided. Thus, for example, the second input to the NAND gate 24 can be supplied from the output of the inverter 22$e$ with the fuse links 26($a \ldots d$) being blown or remain in an open circuit. Another possibility is for the output of the inverter 22$c$ being supplied through the programmable fuse link 26$c$ through 26$d$ and into the second input of the NAND gate 24. In that event, the fuses 26$a$, 26$b$ and 26$e$ would be blown thereby creating an open circuit. The output of the inverter 22 supplied as the input to the NAND gate 24 must be from an inverter which is an even multiple of the number of inverters from the output of the NAND gate 24.

Figure 3:
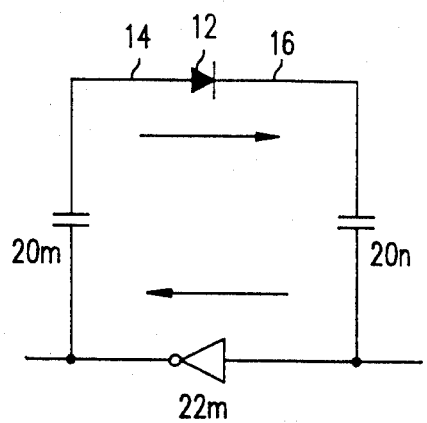
FIG. 3 is a equivalent circuit representation of one stage of the voltage multiplier of the present invention shown in FIG. 2.

Referring to FIG. 3 there is shown a schematic representation of a portion of the pumping stage of the voltage multiplier 10 shown in FIG. 2. As shown in FIG. 3, the MOS transistor 12 can be characterized as a diode having an anode input 14 and a cathode output 16. The inverter 22$m$ generates an output which is supplied to the capacitor 20$m$ and to the anode 14. The cathode 16 of the diode 12 is connected to the capacitor 20$n$ and to the input of the inverter 22$m$.

Figure 4:
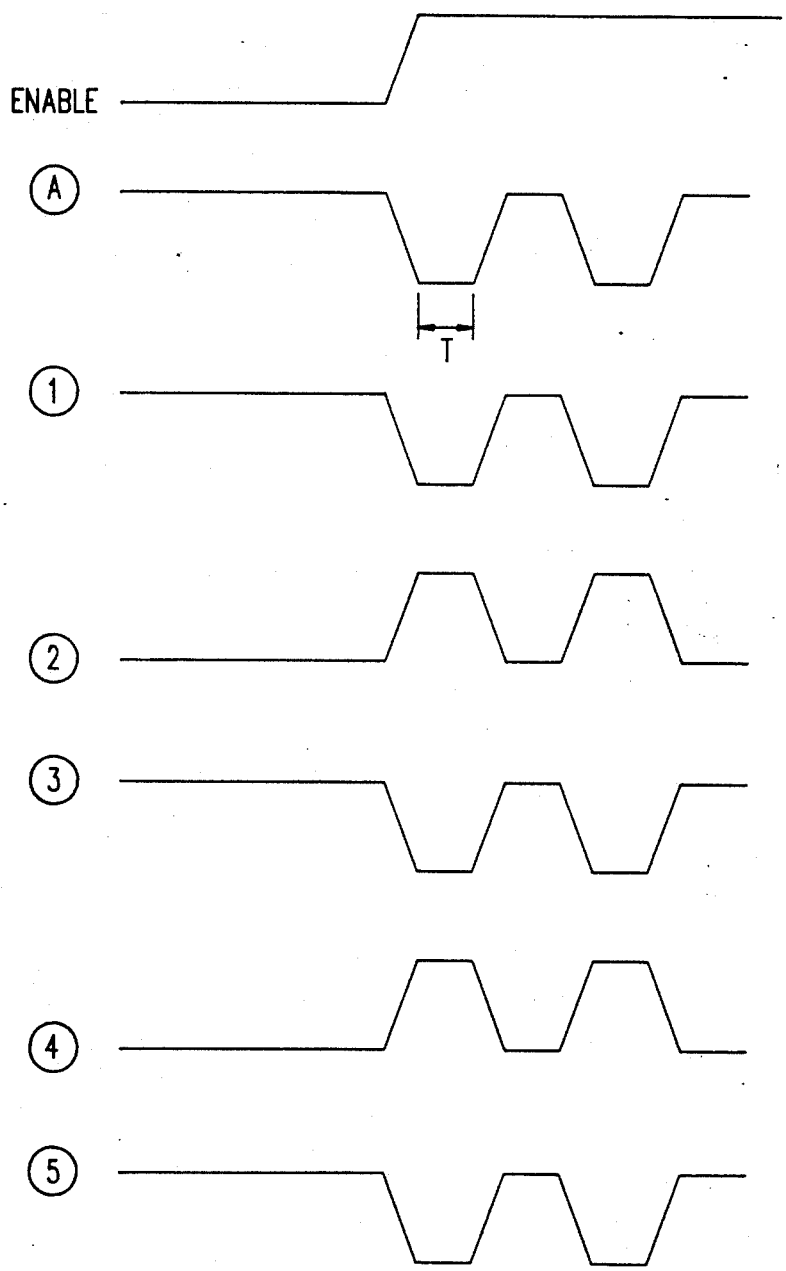
FIG. 4 are various timing diagrams of the enable signal supplied to the voltage multiplier or the charge pump of the present invention and the various oscillating signals generated by the voltage multiplier of the present invention.

As previously stated, in the operation of the voltage multiplier 10 of the present invention, when it is desired to generate the high voltage at the output 16$i$ of the MOS transistor 12$i$, the enable signal is supplied to the NAND gate 24. The enable signal is activated by raising it to a high voltage level such as $V_{dd}$ or $+5$ volts. Referring to FIG. 4 there is shown a waveform of the different oscillating signals that are generated in the operation of the voltage multiplier 10. Prior to the enable signal going high, the other input to the NAND gate 24 (designated as A) is high. This is because with the enable signal low, the output of the NAND gate 24 would always be high. Since the other input to the NAND gate 24 is supplied from an inverter which is an even number from the output of the NAND gate 24, the output of the even number of inverters would also be high. Thus, the signal A would also be high.

When the enable signal goes high, the output of the NAND gate 24 will go low. This is signal number 1 for the first oscillating signal supplied to the capacitor 20$i$ and to the inverter 22$h$. With a low signal supplied to the inverter 22$h$, the output thereof or oscillating signal number 2 would then go high. This is supplied to the capacitor 20$h$. With the second oscillating signal going high, the output of the inverter 22$g$ or the third oscillating signal would then go low. This would result in the fourth oscillating signal going high. This would cause the fifth oscillating signal to go low which is supplied back as the input to the NAND gate 24. With the input signal A to the NAND gate 24 being low, this would result in the first oscillating signal going high. Thus, the cycle would repeat with continual oscillations of on and off occurring in a continual oscillating pattern. Each of the oscillating signals supplied to each of the capacitors 20 is of the same frequency. The amount of time at which a pulse remains high or low as measured by "T" shown in a graph in FIG. 4 is determined by the number of stages of the inverters used to route back as the input to the NAND gate 24. This then adjusts the frequency of the oscillating signals.

There are a number of advantages to the multiplier 10 of the present invention. Because the signal is inverted at each stage and is immediately supplied to the affected capacitor, each inverter is a small driver and drives a small load. Thus, capacitive loading is distributed into each stage of the oscillator. By adjusting the stages of the ring oscillator, the multipler 10 assures that each capacitor 20 receives a well shaped clock signal. Thus, the multiplier 10 may operate extremely fast. In addition, the oscillator draws a smoother current from the power supply than the charge pump 8 of the prior art. The pump 8 of the prior art may create current spikes at the transition of the clock signals. Finally, as shown in FIG. 3, the direction of the current flow through each inverter 22 is opposite in the direction to the current flowing through each of the diodes 12. Since the oscillation of the signal occurs at the input of each of the inverter 22 before the output of each of the inverter 22, this means that the action on the diode 12 occurs at the cathode 16 before the anode 14. Thus, the cathode 16 of each diode 12 is always coupled down before its anode 14 is pumped up. With this sequence, only the anode 14$i$ of the last diode 12$i$ may reach a voltage higher than the $V_{out}$. Breakdown prevention then needs to be only applied to the anode 14$i$ of the last diode 12$i$. As a result, a high frequency voltage multiplying circuit is accomplished. Finally, by providing for a ring oscillator with the capacity to select the appropriate output routing back to the input of the NAND gate 24, the frequency of the oscillating signal can be adjusted.

I claim:

1. A charge pump for use with an electrically erasable and programmable memory device for receiving an enable signal, a first voltage and for generating a second voltage, higher than said first voltage in response thereto, said pump comprising:

a plurality of diode means connected in series, forming a chain having a first diode means and a last diode means, with each diode means having an anode and a cathode with the anode connected to the cathode of an immediately adjacent diode means, and with the cathode of the last diode means supplying said second voltage;

means for supplying said first voltage to said anode of the first diode means;

a plurality of capacitor means, each capacitor means having two ends, a first end connected to an anode of a different one of the diode means;

a plurality of inverter means connected in series, forming a chain having a first inverter means and a last inverter means to produce a plurality of oscillating signals, with each inverter means having an input and an output, with said input connected to the output of an immediately adjacent inverter means, each of said inverter means has its input and output connected to the second end of immediately adjacent capacitor means; and gate means for receiving said enable signal and an output of one of said inverter means and for generating a first oscillating signal in response thereto and for supplying said first oscillating signal to the input of the first inverter means.

2. The pump of claim 1 wherein each inverter means is an inverter.

3. The pump of claim 1 wherein each diode means is a transistor having an input, an output and a gate with said gate connected to said input, and with said input being the anode and the output being the cathode.

4. The pump of claim 1 wherein said gate means is a NAND gate.

5. The pump of claim 4 wherein an even number of inverter means form said chain and receives the first oscillating signal to produce said output of one of said inverter means, supplied to said gate means.

* * * * *